(12) United States Patent
Kamenev et al.

(10) Patent No.: US 11,245,422 B2
(45) Date of Patent: Feb. 8, 2022

(54) DEVICES AND METHODS FOR GENERATING BLOCK PUNCTURED POLAR CODES

(71) Applicant: HUAWEI TECHNOLOGIES CO., LTD., Shenzhen (CN)

(72) Inventors: Mikhail Sergeevich Kamenev, Moscow (RU); Iuliia Borisovna Kameneva, Moscow (RU); Jie Jin, Moscow (RU); Oleg Feat'evich Kurmaev, Moscow (RU)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 16/998,290

(22) Filed: Aug. 20, 2020

(65) Prior Publication Data
US 2020/0403638 A1    Dec. 24, 2020

Related U.S. Application Data

(63) Continuation of application No. PCT/RU2018/000104, filed on Feb. 22, 2018.

(51) Int. Cl.
*H03M 13/00* (2006.01)
*H03M 13/13* (2006.01)

(52) U.S. Cl.
CPC ....... *H03M 13/13* (2013.01); *H03M 13/6362* (2013.01)

(58) Field of Classification Search
CPC .................. H03M 13/13; H03M 13/6362
See application file for complete search history.

(56) References Cited

U.S. PATENT DOCUMENTS 9,503,126 B2 * 11/2016 Vardy ................... H03M 13/13

FOREIGN PATENT DOCUMENTS

WO    2019024555 A1    2/2019

OTHER PUBLICATIONS

Mediatek et al., "Way Forward on Rate-Matching for Polar Code", 3GPP TSG RAN WG1 Meeting #90, R1-1715000, Prague, Czech Republic, Aug. 21, 2017, total 24 pages. XP051328793.

(Continued)

*Primary Examiner* — Samir W Rizk
(74) *Attorney, Agent, or Firm* — Rimon PC

(57) ABSTRACT

The device and method disclosed herein are configured for generating a polar code of length N and dimension K on the basis of an original polar code being defined by a code sequence S having $N_{max}$ bit indices sorted from least reliable to most reliable sub-channels. The device comprises a processing unit configured to: (a) generate an auxiliary code sequence having $N_{max}/2$ bit indices by removing bit indices greater than or equal to $N_{max}/2$ from the code sequence S; (b) remove from the auxiliary code sequence the last $N_R$ bit indices to generate a modified auxiliary code sequence; and (c) generate the polar code of length N and dimension K by puncturing the original polar code on the basis of a puncturing set defined by the last $p=N_{max}-N$ bit indices of the modified auxiliary code sequence.

21 Claims, 9 Drawing Sheets

(56) References Cited

OTHER PUBLICATIONS

Qualcomm Incorporated, "Rate-matching scheme for control channel", 3GPP TSG-RAN WG1 RAN1#90, R1-1715267, Aug. 21, 2017, Prague, CZ, total 19 pages. XP051328741.

Ericsson, "Rate Matching Schemes for Polar Codes", 3GPP TSG-RAN WG1 #89, R1-1707075, Hangzhou, P.R. China May 15, 2017, total 5 pages. XP051272303.

E. Arikan, Channel polarization: a method for constructing capacity achieving codes for symmetric binary-input memoryless channels, IEEE Transactions on Information Theory, vol. 55, No. 7, Jul. 1, 2009, pp. 3051-3073.

I. Tal and A. Vardy, List decoding of polar codes, in IEEE International Symposium on Information Theory Proceedings (ISIT), St. Petersburg, Russia, Jul. 1, 2011. total 5 pages.

Huawei, HiSilicon: "Rate matching for Polar code", 3GPP TSG RAN WG1 Meeting #90, R1-1712169, Prague, Czech Republic, Aug. 21, 2017, total 5 pages.

Qualcomm: "Rate-matching scheme for control channel".3GPP TSG-RAN WG1 RAN1#90, R1-1713470, Aug. 21, 2017 Prague, CZ, total 9 pages.

MediaTek Inc.: "Polar rate-matching design and performance", 3GPP TSG RAN WG1 RAN1 Meeting #90, R1-1713705, Prague, Czech, Aug. 21, 2017, total 7 pages.

Huawei, HiSilicon: "Rate matching for Polar code", 3GPP TSG RAN WG1 NR Ad-Hoc#2, R1-1711702, Qingdao, China, Jun. 27, 2017, total 6 pages.

Qualcomm Incorporated, Polar code information bit allocation and nested extension construction, 3GPP TSG-RAN WG1 NR#1, R1-1701187, Jan. 16, 2017, Spokane, USA. Total 13 pages.

Huawei, HiSilicon, Polar code design and rate matching, 3GPP TSG RAN WG1 #86, R1-167209, Gothenburg, Sweden, Aug. 22, 2016. total 5 pages.

RAN1 Chairman s Notes, 3GPP TSG RAN WG1 Meeting #90, Prague, Czech Republic, Prague, CZ, Oct. 9, 2017. total 44 pages.

S. ten Brink, Convergence of iterative decoding, Electron. Lett., vol. 35, No. 13, pp. 1117-1118, Jun. 1, 1999.

\* cited by examiner

DEVICES AND METHODS FOR GENERATING BLOCK PUNCTURED POLAR CODES

CROSS-REFERENCE TO RELATED APPLICATIONS

This application is a continuation of International Application No. PCT/RU2018/000104, filed on Feb. 22, 2018, the disclosure of which is hereby incorporated by reference in its entirety.

TECHNICAL FIELD

In general, the present invention relates to data coding in communication systems. More specifically, the present invention relates to devices and methods for generating polar codes and coding data using these polar codes.

BACKGROUND

Polar codes have been shown to achieve the Shannon capacity of many channels with the length of conventional polar codes generally being equal to $N=2^m$. However, various applications require polar codes with different dimensions and much finer granularity of code lengths. For this reason different approaches have been proposed in order to construct polar codes of length different from $N=2^m$. These approaches include reliability re-calculation, bit reversal (BRV) shortening, group puncturing, and others, some of which will be described further below.

The construction of a polar code of length $N=2^m$ using one long code sequence has been adopted for the future 3GGP 5G standard. Although the sequence allows constructing a polar code of length $N=2^m$ with very good performance, additional rate matching techniques are required in order to construct polar codes of any length. For instance, a so-called BRMIAA rate-matching scheme uses block puncturing/shortening together with some additional calculations in order to evaluate the number of information (unfrozen) bits in the upper N/2 and the lower N/2 bits of a polar code. According to the rate-matching scheme on-line calculation is done in accordance with following equations:

$$\text{Block puncture: } K^- = \left\lfloor \left( R^2 + \left( -\frac{\left|R - \frac{1}{2}\right|}{32} + \frac{1}{64} \right) \right) \times (M - N/2) \right\rfloor, \quad (1)$$
$$K^+ = K - K^-, \text{ and}$$

$$\text{Block shorten: } K^+ = \left\lfloor \left( 2R - R^2 - \left( -\frac{\left|R - \frac{1}{2}\right|}{32} + \frac{1}{64} \right) \right) \times (M - N/2) \right\rfloor, \quad (2)$$
$$K^- = K - K^+,$$

where $$R = \frac{K}{N}$$

K denotes the total number of non-frozen bits to be allocated. Although the equations above are based on a strong theoretical analysis, namely mutual information transfer chart approximation for AWGN channel as described in S. ten Brink, "Convergence of iterative decoding," Electron. Lett., vol. 35, no. 13, pp. 1117-1118, June 1999, the performance of codes with large K and rather small R significantly degrades for some K. This is because the considered type of analysis works fine for a successive cancelation decoder with list size 1, while it doesn't consider the case of a successive cancelation decoder with a larger list size.

BRV shortening allows constructing polar codes of any length by setting predefined values to some information bits. The set of predefined bits is chosen in such a way that after the encoding procedure the values of corresponding coded bits can be determined based only on the set. Since it is assumed that the set of shortened bits and its values are known on the receiver side, it is useless to transmit them over a noisy channel. Prior to the decoding procedure the decoder sets the LLRs (log-likelihood ratios) of un-transmitted bits to some big quantity in accordance with its values. For simplicity, it is generally considered that all shortened bits are equal to zero.

In order to construct a polar code of length $N \neq 2^m$ one needs to shorten S bits. The set of shortened bits of size S is generally determined as follows: (i) apply a bit reversal permutation to the sequence $[0, 1, \ldots, N-1]$: $B = BRV([0, 1, \ldots, N-1])$; (ii) select the last S elements from the sequence B and set the bits with corresponding indexes as frozen. This process is illustrated in FIG. 1. BRV shortening benefits from its simplicity, but it demonstrates poor performance in comparison with puncturing for low code rates.

Another approach which has been adopted for the future 3GGP 5G standard is group puncturing. In group puncturing a codeword is divided into groups, for instance 32 groups of size N/32, and then a permutation is applied to the groups. The set of punctured/shortened bits is determined in accordance with the permuted sequence by taking the necessary number of bits from the beginning/end. A disadvantage of this approach is that the constructed codes are heavily punctured and, consequently, have a very poor performance especially for rates from 1/4 to 2/5. This issue can be partially mitigated using repetition techniques, but this does not work for all cases.

Thus, there is a need for improved devices and methods for generating polar codes of any given length and dimension with good performance using puncturing techniques and for coding data with these polar codes.

SUMMARY

It is an object of the invention to provide improved devices and methods for generating polar codes of any given length and dimension with good performance using puncturing techniques and for coding data with these polar codes.

The foregoing and other objects are achieved by the subject matter of the independent claims. Further implementation forms are apparent from the dependent claims, the description and the figures.

Generally, embodiments of the invention are based on the idea proposed of puncturing the bits in such a way that reliability order of the bits in the code sequence is preserved. This allows constructing punctured polar codes, using the same sequence as for polar codes of length $2^m$, without the need for a recalculation of the bit reliabilities.

According to a first aspect the invention relates to a device for generating a polar code of length N and dimension K on the basis of an original polar code being defined by a code sequence S having $N_{max}$ bit indices sorted from least reliable to most reliable sub-channels. The device comprises a processing unit configured to: (a) generate an auxiliary code sequence having $N_{max}/2$ bit indices by removing bit indices greater than or equal to $N_{max}/2$ from the code sequence S; (b) remove from the auxiliary code sequence the last $N_R$ bit indices to generate a modified auxiliary code sequence, wherein $N_R$ denotes the number of removed bits and wherein the processing unit is configured to determine the number of removed bits $N_R$ on the basis of $N_{max}$, N and a predefined code rate R; and (c) generate the polar code of length N and dimension K by puncturing the original polar code on the basis of a puncturing set defined by the last $p=N_{max}-N$ bit indices of the modified auxiliary code sequence.

Advantageously, the inventive generation of the puncturing set implemented in the device according to the first aspect of the invention allows obtaining punctured polar codes from one long code sequence for small code rates and various code dimensions without performance degradation.

In a further possible implementation form of the first aspect, the processing unit is configured to determine the number of removed bits $N_R$ on the basis of the following equation:

$$N_R = \mathrm{round}(ap+b),$$

wherein round( . . . ) denotes a rounding function and a and b denote parameters, which depend on $N_{max}$ and the predefined code rate R. In a further possible implementation form of the first aspect, the processing unit is configured to determine the number of removed bits $N_R$ on the basis of the following equation:

$$N_R = \max(0, \mathrm{round}(ap+b)),$$

wherein max( . . . ) denotes the maximum function.

In a further possible implementation form of the first aspect, the device further comprises a memory unit, wherein the processing unit is configured to determine the parameters a and b on the basis of a look-up table stored in the memory unit.

In a further possible implementation form of the first aspect, the processing unit is configured to determine the parameters a and b on the basis of auxiliary parameters a' and b' provided in the look-up table and the following equations:

$$a = f(R)a',$$

$$b = f(R)b',$$

wherein f(R) denotes a function of the predefined code rate R and wherein the auxiliary parameters a' and b' depend on $N_{max}$.

In a further possible implementation form of the first aspect, the processing unit is configured to determine the auxiliary parameters a' and b' on the basis of the following look-up table:

| $N_{max}$ | b' | a' |
|---|---|---|
| 64 | 32.455 | −0.87273 |
| 128 | 77.319 | −1.2332 |
| 256 | 138.56 | −1.1028 |
| 512 | 275.89 | −1.1111 |
| 1024 | 572.83 | −1.1649 |

In a further possible implementation form of the first aspect, the processing unit is configured to determine the parameters a and b on the basis of the auxiliary parameters a' and b' provided in the look-up table and the following equations:

$$a = R^2 a',$$

$$b = R^2 b'.$$

According to a second aspect the invention relates to a communication apparatus comprising a channel encoder comprising a device for generating a polar code according to the first aspect of the invention.

In a further possible implementation form of the second aspect, the channel encoder is configured to encode an information message of size K into a codeword of size N on the basis of the polar code generated by the processing unit of the device.

In a further possible implementation form of the second aspect, the channel encoder is configured to use as a set of frozen bits the bits defined by the $N_{max}-N$ bit indices of the code sequence S defined by the puncturing set and the first N-K bit indices of the code sequence S without the puncturing set for encoding an information message of size K into a codeword of size N on the basis of the polar code generated by the processing unit of the device.

According to a third aspect the invention relates to a communication apparatus comprising a channel decoder comprising a device for generating a polar code according to the first aspect of the invention.

In a further possible implementation form of the third aspect, the channel decoder is configured to decode N log likelihood ratios of codeword bits into an information message of size K on the basis of the polar code generated by the processing unit of the device.

In a further possible implementation form of the third aspect, the channel decoder is configured to use as a set of frozen bits the bits defined by the $N_{max}-N$ bit indices of the code sequence S defined by the puncturing set and the first N-K bit indices of the code sequence S without the puncturing set for decoding N log likelihood ratios of codeword bits into an information message of size K on the basis of the polar code generated by the processing unit of the device.

According to a fourth aspect the invention relates to a method for generating a polar code of length N and dimension K on the basis of an original polar code being defined by a code sequence S having $N_{max}$ bit indices sorted from least reliable to most reliable sub-channels. The method comprises the steps of: (a) generating an auxiliary code sequence having $N_{max}/2$ bit indices by removing bit indices greater than or equal to $N_{max}/2$ from the code sequence S; (b) removing from the auxiliary code sequence the last $N_R$ bit indices to generate a modified auxiliary code sequence, wherein $N_R$ denotes the number of removed bits and wherein the number of removed bits $N_R$ are determined on the basis of $N_{max}$, N and a predefined code rate R; and (c) generating the polar code of length N and dimension K by puncturing the original polar code on the basis of a puncturing set defined by the last $p=N_{max}-N$ bit indices of the modified auxiliary code sequence.

The method according to the fourth aspect of the invention can be performed by the device according to the first aspect of the invention. Further features of the method according to the fourth aspect of the invention result directly from the functionality of the device according to the first aspect of the invention and its different implementation forms described above and below.

According to a fifth aspect, the invention relates to a computer program comprising a program code for performing the method of the fourth aspect when executed on a computer.

The invention can be implemented in hardware and/or software.

BRIEF DESCRIPTION OF THE DRAWINGS

Further embodiments of the invention will be described with respect to the following figures, wherein.

In the various figures, identical reference signs will be used for identical or at least functionally equivalent features.

DETAILED DESCRIPTION OF EMBODIMENTS

In the following description, reference is made to the accompanying drawings, which form part of the disclosure, and in which are shown, by way of illustration, specific aspects in which the present invention may be placed. It is understood that other aspects may be utilized and structural or logical changes may be made without departing from the scope of the present invention. The following detailed description, therefore, is not to be taken in a limiting sense, as the scope of the present invention is defined by the appended claims.

For instance, it is understood that a disclosure in connection with a described method may also hold true for a corresponding device or system configured to perform the method and vice versa. For example, if a specific method step is described, a corresponding device may include a unit to perform the described method step, even if such unit is not explicitly described or illustrated in the figures. Further, it is understood that the features of the various exemplary aspects described herein may be combined with each other, unless specifically noted otherwise.

Figure 1:
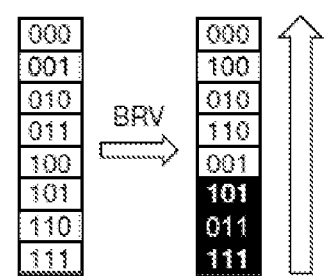
FIG. 1 shows a schematic diagram illustrating conventional BRV shortening.
Figure 2:
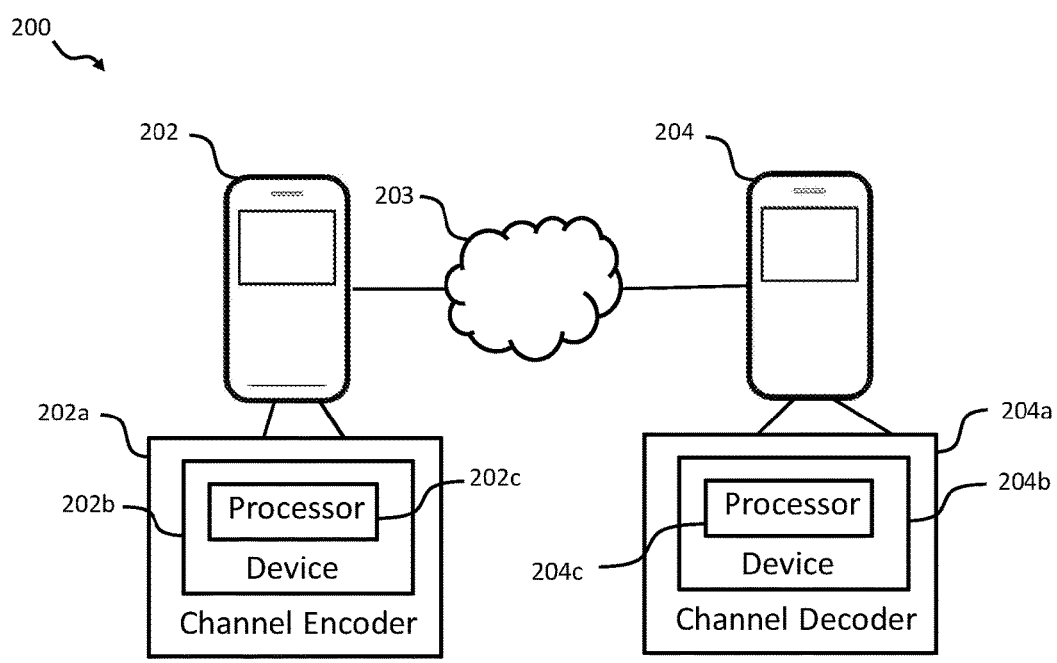
FIG. 2 shows a schematic diagram of a communication system with a communication apparatus comprising a device for generating a polar code according to an embodiment.

FIG. 2 shows a schematic diagram of a communication system 200 with a first communication apparatus 202 comprising a device 202b for generating a polar code according to an embodiment and a second communication apparatus 204 comprising a device 204b for generating a polar code according to an embodiment. In an embodiment, the first communication apparatus 202 and/or the second communication apparatus 204 could be mobile phones or other communication devices configured to communicate via a communication channel 203.

Generally, a polar code is a (N=$2^m$, K) linear block code generated by K rows $j_i \in \{0, \ldots, N-1\} \backslash F$, $0 \leq i < K$ of matrix $$A_m = \begin{pmatrix} 1 & 0 \\ 1 & 1 \end{pmatrix}^{\otimes m},$$

where $S^{\otimes m}$ denotes the m-fold Kronecker product of the matrix S with itself. The encoding algorithm is as follows: $c_0^{N-1} = u_0^{N-1} A_{log_2 N}$, where $u_i^j = (u_i, \ldots, u_j)$, $u_l = 0$ for $l \in F$ and the remaining elements of the vector u are set by the payload symbols to be encoded. F is the set of frozen bits constructed, for instance, as the set of indexes l of low-capacity or high error probability synthetic bit subchannels.

The first communication apparatus 202 comprises a channel encoder 202a, wherein the channel encoder 202a comprises the device 202b for generating a polar code of length N and dimension K on the basis of an original polar code being defined by a code sequence S having $N_{max}$ bit indices sorted from least reliable to most reliable sub-channels. $N_{max}$ is usually a power of 2, i.e. $N_{max} = 2^m$, N and K can be arbitrary positive integers smaller than $N_{max}$ with $N_{max} = 2^{\lceil log_2 N \rceil}$ and $0 < K \leq N$. The channel encoder 202a is configured to encode data using the generated polar code of length N and dimension K and provide the encoded data via the communication channel 203 to the second communication apparatus 204. Differently put, the channel encoder 202a is configured to encode an information message of size K into a codeword of size N on the basis of the polar code generated by the processing unit 202c of the device 202b.

The second communication apparatus 204 comprises a channel decoder 204a, wherein the channel decoder 204a comprises a device 204b for generating a polar code of length N and dimension K on the basis of an original polar code being defined by a code sequence S having $N_{max}$ bit indices sorted from least reliable to most reliable sub-channels. The channel decoder 204a of the second communication apparatus 204 is configured to decode the encoded data provided by the first communication apparatus 202, for instance, on the basis of a successive-cancellation (SC) scheme or a successive-cancellation list (SCL) scheme. In an embodiment, the channel decoder 204a is configured to decode N log likelihood ratios of codeword bits into an information message of size K on the basis of the polar code generated by the processing unit 204c of the device 204b.

As can be taken from FIG. 2, the device 202b of the first communication apparatus 202 comprises a processing unit 202c and the device 204b of the second communication apparatus 204 comprises a processing unit 204c. In the following the functionality of the processing unit 202c of the device 202b of the first communication apparatus 202 will be described in more detail with the understanding that the processing unit 204c of the device 204b of the second communication apparatus 204 provides the same functionality.

As will be described in more detail further below, the processing unit 202c of the device 202b of the first communication apparatus 202 is configured to: (a) generate an auxiliary code sequence having $N_{max}/2$ bit indices by removing bit indices greater than or equal to $N_{max}/2$ from the code sequence S; (b) remove from the auxiliary code sequence the last $N_R$ bit indices to generate a modified auxiliary code sequence, wherein $N_R$ denotes the number of removed bits and wherein the processing unit 202c is configured to determine the number of removed bits $N_R$ on the basis of $N_{max}$, N and a predefined code rate R; and (c) generate the polar code of length N and dimension K by puncturing the original polar code on the basis of a puncturing set defined by the last $p = N_{max} - N$ bit indices of the modified auxiliary code sequence.

Figure 3:
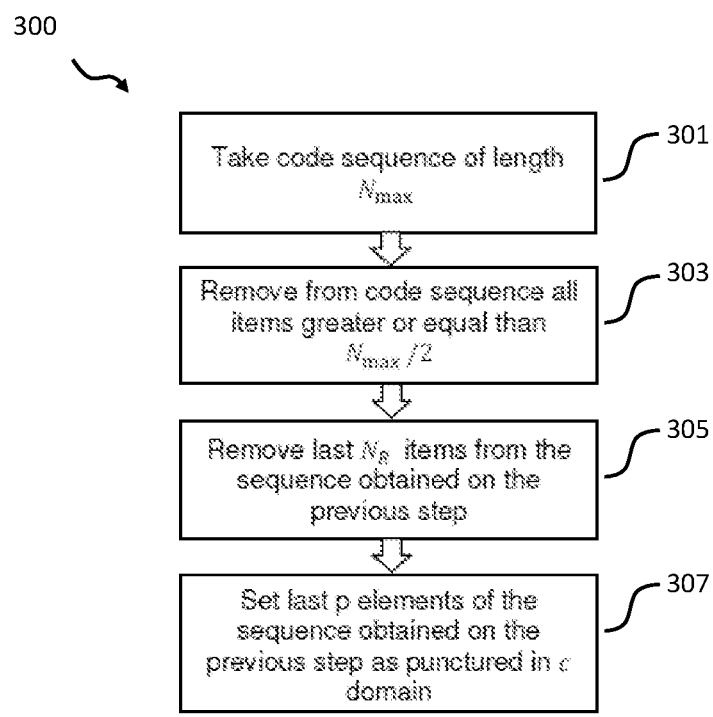
FIG. 3 shows a flow diagram illustrating different processing steps implemented in a device for generating a polar code according to an embodiment.
Figure 4:
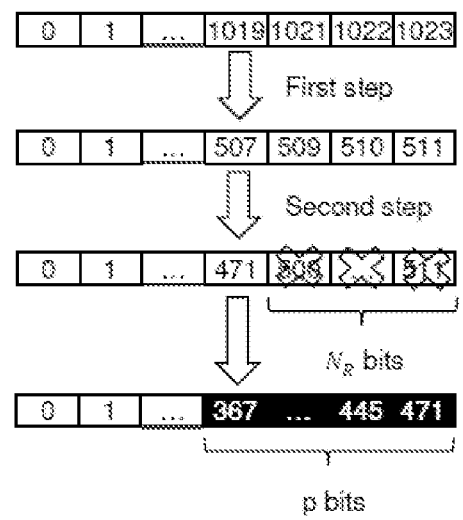
FIG. 4 shows a schematic illustrating an example for the puncturing scheme implemented in a device for generating a polar code according to an embodiment.

The above described construction of the puncturing set of bits or bit indices is illustrated in FIG. 3. Having a code sequence S of length $N_{max}$ (stage 301), all indices greater than or equal to $N_{max}/2$ are removed from the code sequence S of length $N_{max}$ (stage 303). In a further stage 305, the last $N_R$ indices are removed from the code sequence of length $N_{max}/2$. If $S_{N_R}$ denotes sequence obtained after the stage 305, then the punctured bits in the c domain are the last elements of the sequence $S_{N_R}$. The scheme shown in FIG. 3 is illustrated by an example shown in FIG. 4 for a code sequence S of length 1024.

Figure 5:
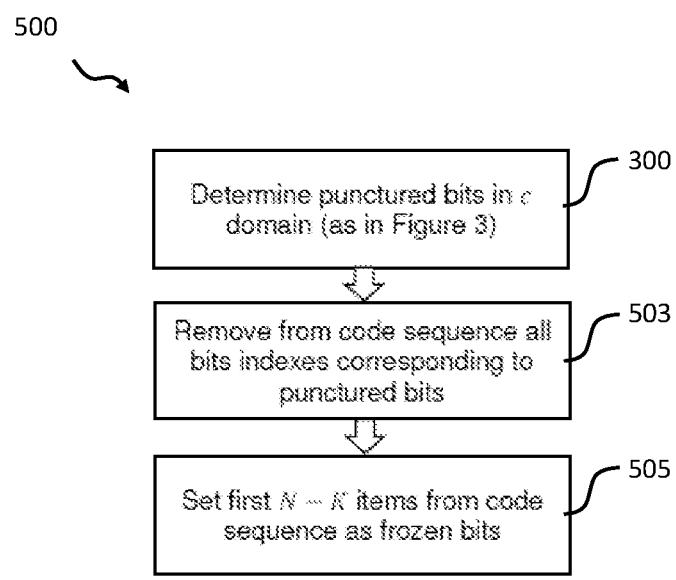
FIG. 5 shows a flow diagram illustrating different processing steps implemented in a device for generating a polar code according to an embodiment.

FIG. 5 illustrates how the construction of the puncturing set of bit indices shown in FIG. 3 is implemented in the device 202b, 204b for generating a polar code of length N and dimension K on the basis of an original polar code being defined by a code sequence S having $N_{max}$ bit indices sorted from least reliable to most reliable sub-channels. After the construction of the puncturing set of bit indices P (stage 300), all bit indices of the puncturing set of bit indices P are removed from the code sequence S (stage 503). Thereafter, the first N−K indices of the code sequence S are set as frozen bits (stage 505).

In an embodiment, the processing unit 202c of the device 202b of the first communication apparatus 202 is configured to determine the number of removed bits $N_R$ on the basis of the following equation:

$$N_R = \text{round}(ap+b),$$

wherein round( . . . ) denotes a rounding function and a and b denote parameters, which depend on $N_{max}$ and the predefined code rate R. In an embodiment, the rounding function can be a ceiling function or a floor function. In an embodiment, the processing unit 202c of the device 202b of the first communication apparatus 202 is configured to determine the number of removed bits $N_R$ on the basis of the following equation:

$$N_R = \max(0, \text{round}(ap+b)),$$

wherein max( . . . ) denotes the maximum function.

In an embodiment, the device 202b of the first communication apparatus 202 (and likewise the device 204b of the second communication apparatus 204) can further comprise a memory unit, wherein the processing unit 202c is configured to determine the parameters a and b on the basis of a look-up table stored in the memory unit.

In an embodiment, the processing unit 202c of the device 202b of the first communication apparatus 202 is configured to determine the parameters a and b on the basis of auxiliary parameters a' and b' provided in the look-up table and the following equations:

$$a = f(R)a',$$

$$b = f(R)b',$$

wherein f(R) denotes a function of the predefined code rate R and wherein the auxiliary parameters a' and b' depend on $N_{max}$.

In an embodiment, the processing unit 202c of the device 202b of the first communication apparatus 202 is configured to determine the auxiliary parameters a' and b' on the basis of the following look-up table:

| $N_{max}$ | b' | a' |
|---|---|---|
| 64 | 32.455 | −0.87273 |
| 128 | 77.319 | −1.2332 |
| 256 | 138.56 | −1.1028 |
| 512 | 275.89 | −1.1111 |
| 1024 | 572.83 | −1.1649 |

In an embodiment, the processing unit 202c of the device 202b of the first communication apparatus 202 is configured to determine the parameters a and b on the basis of the auxiliary parameters a' and b' provided in the look-up table and the following equations:

$$a = R^2 a',$$

$$b = R^2 b'.$$

In an embodiment, the channel encoder 202a of the first communication apparatus 202 is configured to use as a set of frozen bits the bits defined by the $N_{max}$−N bit indices of the code sequence S defined by the puncturing set and the first N−K bit indices of the code sequence S without the puncturing set for encoding an information message of size K into a codeword of size N on the basis of the polar code generated by the processing unit 202c of the device 202b.

Likewise, in an embodiment, the channel decoder 204a of the second communication apparatus is configured to use as a set of frozen bits the bits defined by the $N_{max}$−N bit indices of the code sequence S defined by the puncturing set and the first N−K bit indices of the code sequence S without the puncturing set for decoding N log likelihood ratios of codeword bits into an information message of size K on the basis of the polar code generated by the processing unit 204c of the device 204b.

In the following, some of the embodiments described above are summarized in an algorithmic form.

The scheme for generating the puncturing set P as implemented in the device 202a, 204a according to an embodiment can be summarized as the following Algorithm 1:

Input:
  Code sequence S of length $N_{max}$;
  Number of punctured bits p;
  Lookup table LT (as described above);
  Code rate R.
Output:
  Set P of bits to be punctured.
  1. Set $S_2$ to be vector of size $N_{max}/2$;
  2. j=0;
  3. For i from 0 to $N_{max}$−1:
    a. If $S[i] < N_{max}/2$ then:
      i. $S_2[j] = S[i]$;
      ii. j=j+1.
  4. Based on $N_{max}$ and lookup table LT, set a', b';
  5. a=a'$R^2$, b=b'$R^2$;
  6. $N_R$=round(ap+b) or $N_R$=max(0,round(ap+b));
  7. P=$S_2[N_{max}-N_R-p, \ldots, N_{max}-N_R-1]$;

The scheme for encoding an information message of length K into a codeword of length N, using a ($N_{max}=2^{\lceil \log_2 N \rceil}$, K) polar code as implemented in the channel encoder 202a according to an embodiment can be summarized as the following Algorithm 2:

Input:
  Bit sequence I of length K;
  Required codeword length N, $N_{max}=2^{\lceil \log_2 N \rceil}$;
  Code sequence S of length $N_{max}$;
  Lookup table LT (as described above).
Output:
  Codeword C of length N.
  1. Using Algorithm 1, determine set of punctured bits P of size p=$N_{max}$−N;
  2. S=S\P;
  3. Frozen bits set F=S[0, . . . , N−K−1]∪P;

4. Encode message I into codeword C using ($N_{max}$, K) Polar code, with frozen channels defined in accordance with set F;

5. C=C[{0, . . . , $N_{max}$−1}\P].

The scheme for decoding the codeword obtained using Algorithm 2 as implemented in the channel decoder 204a according to an embodiment can be summarized as the following Algorithm 3:

Input:
Vector L of log likelihood ratios (LLRs) of codeword bits of length N, $N_{max}=2^{\lceil log_2 N \rceil}$;
Required information message length K;
Code sequence S of length $N_{max}$;
Lookup table LT (as described above).

Output:
Information message I of length K.

1. Using Algorithm 1, determine set of punctured bits P of size p=$N_{max}$−N;
2. Set $L_F$ to be vector of size $N_{max}$ consisting of all zeroes;
3. j=0;
4. For i from 0 to $N_{max}$−1:
   a. If i∈P then continue;
   b. $L_F[i]=L[j]$;
   c. j=j+1;
5. S=S\P;
6. Frozen bits set F=S[0, . . . , N−K−1]∪P;
7. Decode codeword defined by LLRs vector $L_F$ into information message I using ($N_{max}$, K) Polar code, with frozen channels defined in accordance with set F.

Figure 6:
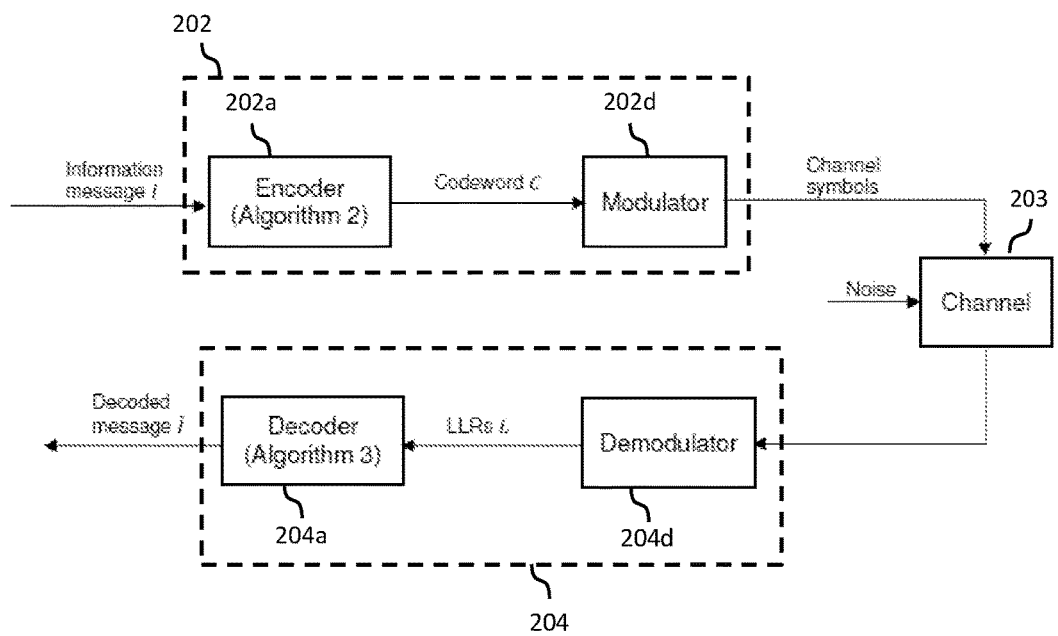
FIG. 6 shows a schematic diagram of a communication system comprising a device for generating a polar code according to an embodiment.

FIG. 6 shows a further embodiment of the communication system 200 of FIG. 2. In the embodiment shown in FIG. 6, the first communication apparatus 202 further comprises a modulator 202d for transforming the codeword into channel symbols and the second communication apparatus 204 further comprises a demodulator 204d for generating a plurality of LLRs on the basis of the noisy channel symbols received via the communication channel 203 from the first communication apparatus 202 and providing the plurality of LLRs to the channel decoder 204a for retrieving the decoded information message.

The puncturing scheme implemented in embodiments of the invention allows constructing polar codes of any length, which demonstrate a better or similar performance in comparison with polar codes generated by rate matching schemes. Corresponding simulation results for code rates 1/3, 1/4, . . . , 1/8 are presented in FIG. 7. Results for cases relevant to ultra-reliable low latency channel (URLLC) communication are presented in FIG. 8.

Figure 7:
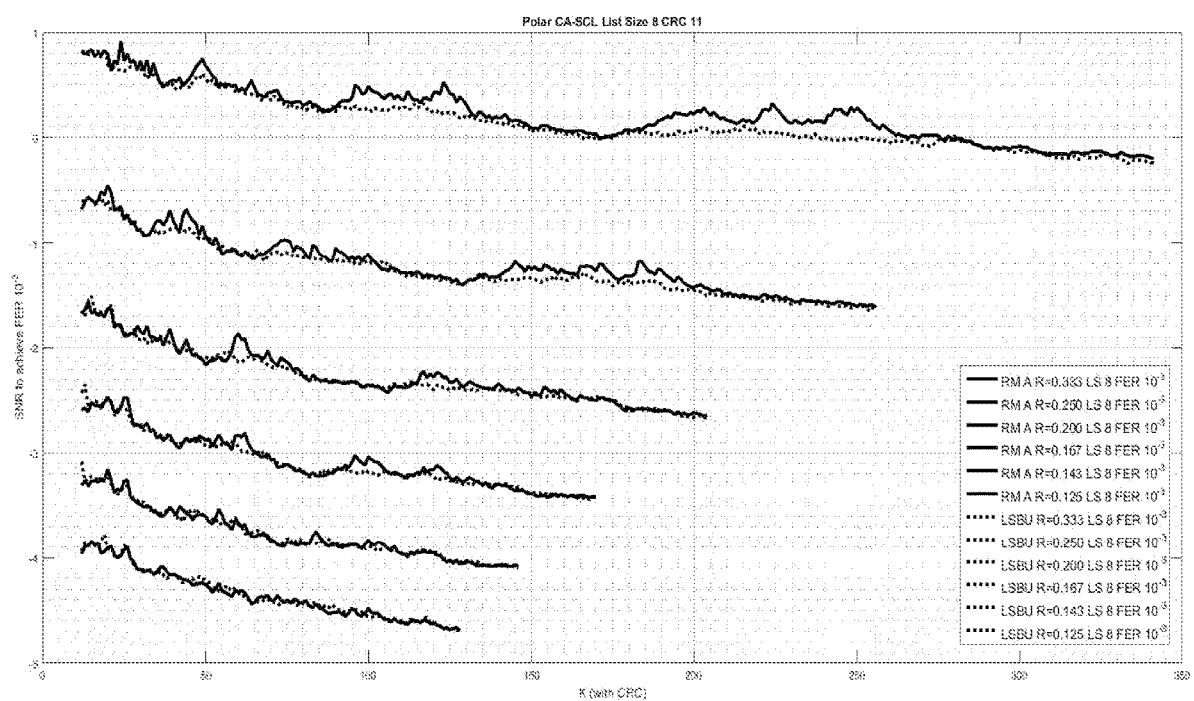
FIG. 7 shows a schematic diagram illustrating the performance of polar codes generated by a device for generating a polar code according to an embodiment.

In FIG. 7 each curve corresponds to some fixed code rate. The solid curves correspond to the scheme adopted for the future 5G enhanced mobile broadband (eMBB) control channel. The dashed lines correspond to the puncturing scheme implemented in embodiments of the invention. The dimension is plotted along the X axis and the SNR needed to achieve a Frame Error Rate (FER) of $10^{-3}$ is plotted along the Y axis. The results have been obtained using a CA-SCL decoder with list size 8 and CRC 11.

Figure 8:
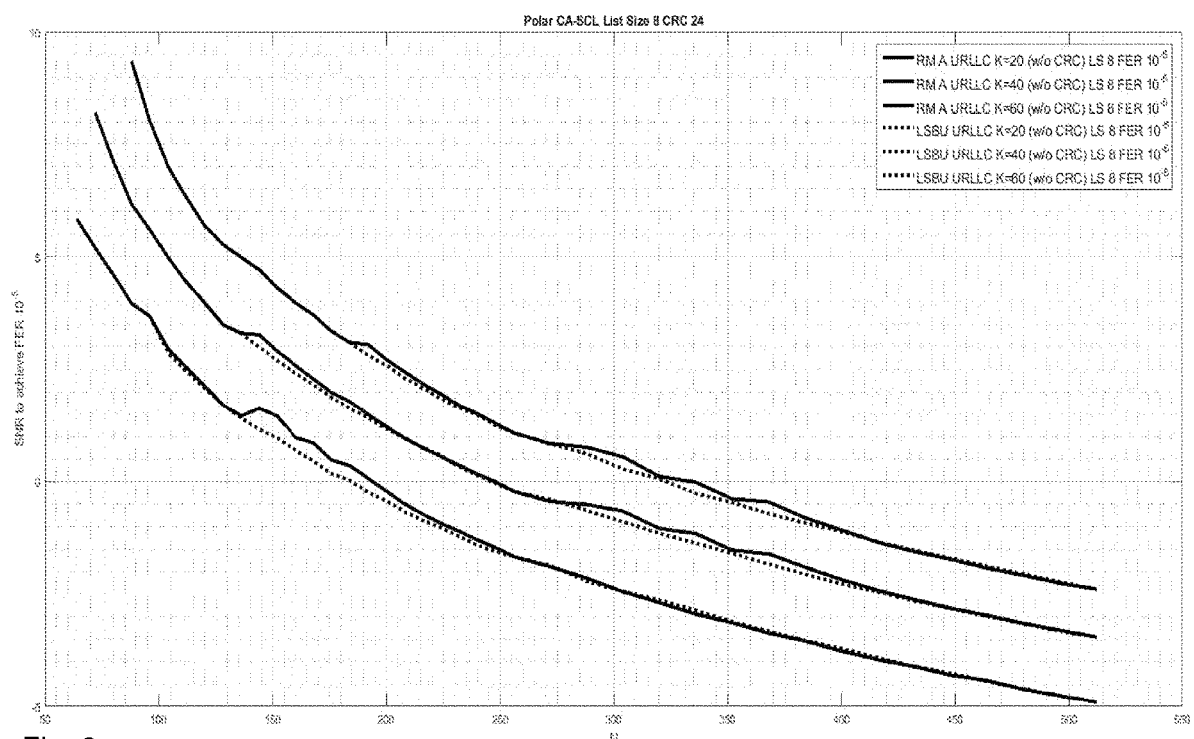
FIG. 8 shows a schematic diagram illustrating the performance of polar codes generated by a device for generating a polar code according to an embodiment.

In FIG. 8 each curve corresponds to some fixed dimension. The solid curves correspond to the scheme adopted for the future 5G eMBB control channel. The dashed lines correspond to the puncturing scheme implemented in embodiments of the invention. The code length is plotted along the X axis, while the SNR needed to achieve a Frame Error Rate of $10^{-5}$ is plotted along the Y axis. The results have been obtained using a CA-SCL decoder with list size 8 and CRC 24.

Figure 9:
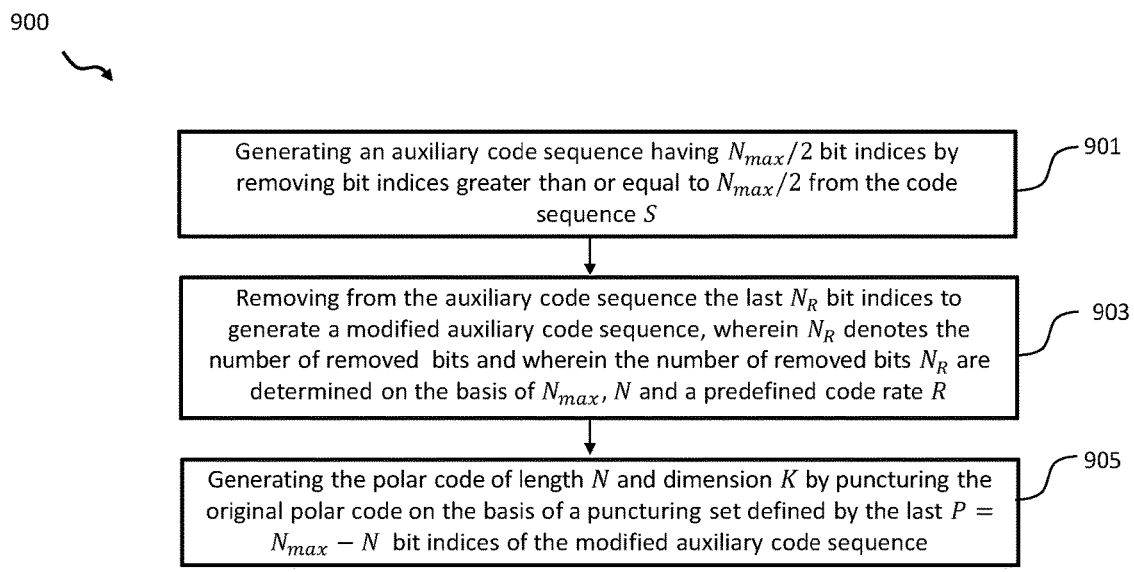
FIG. 9 shows a flow diagram illustrating a method for generating a polar code according to an embodiment.

FIG. 9 illustrates a corresponding method 900 for generating a polar code of length N and dimension K on the basis of an original polar code being defined by a code sequence S having $N_{max}$ bit indices sorted from least reliable to most reliable sub-channels. The method 900 comprises the steps of: (a) generating 901 an auxiliary code sequence having $N_{max}/2$ bit indices by removing bit indices greater than or equal to $N_{max}/2$ from the code sequence S; (b) removing 903 from the auxiliary code sequence the last $N_R$ bit indices to generate a modified auxiliary code sequence, wherein $N_R$ denotes the number of removed bits and wherein the number of removed bits $N_R$ are determined on the basis of $N_{max}$, N and a predefined code rate R; and (c) generating 905 the polar code of length N and dimension K by puncturing the original polar code on the basis of a puncturing set defined by the last p=$N_{max}$−N bit indices of the modified auxiliary code sequence.

While a particular feature or aspect of the disclosure may have been disclosed with respect to only one of several implementations or embodiments, such feature or aspect may be combined with one or more other features or aspects of the other implementations or embodiments as may be desired and advantageous for any given or particular application. Furthermore, to the extent that the terms "include", "have", "with", or other variants thereof are used in either the detailed description or the claims, such terms are intended to be inclusive in a manner similar to the term "comprise". Also, the terms "exemplary", "for example" and "e.g." are merely meant as an example, rather than the best or optimal. The terms "coupled" and "connected", along with derivatives may have been used. It should be understood that these terms may have been used to indicate that two elements cooperate or interact with each other regardless whether they are in direct physical or electrical contact, or they are not in direct contact with each other.

Although specific aspects have been illustrated and described herein, it will be appreciated by those of ordinary skill in the art that a variety of alternate and/or equivalent implementations may be substituted for the specific aspects shown and described without departing from the scope of the present disclosure. This application is intended to cover any adaptations or variations of the specific aspects discussed herein.

Although the elements in the following claims are recited in a particular sequence with corresponding labeling, unless the claim recitations otherwise imply a particular sequence for implementing some or all of those elements, those elements are not necessarily intended to be limited to being implemented in that particular sequence.

Many alternatives, modifications, and variations will be apparent to those skilled in the art in light of the above teachings. Of course, those skilled in the art readily recognize that there are numerous applications of the invention beyond those described herein. While the present invention has been described with reference to one or more particular embodiments, those skilled in the art recognize that many changes may be made thereto without departing from the scope of the present invention. It is therefore to be understood that within the scope of the appended claims and their equivalents, the invention may be practiced otherwise than as specifically described herein.

What is claimed is:

1. A device for generating a polar code of length N and dimension K on the basis of an original polar code being defined by a code sequence S having $N_{max}$ bit indices, wherein the device comprises a processor configured to:

generate an auxiliary code sequence having $N_{max}/2$ bit indices by removing bit indices greater than or equal to $N_{max}/2$ from the code sequence S;

remove from the auxiliary code sequence the last $N_R$ bit indices to generate a modified auxiliary code sequence, wherein $N_R$ denotes the number of removed bits;

determine the number of removed bits $N_R$ on the basis of $N_{max}$, N and a predefined code rate R; and generate the polar code of length N and dimension K by puncturing the original polar code on the basis of a puncturing set defined by the last $p=N_{max}-N$ bit indices of the modified auxiliary code sequence.

2. The device of claim 1, wherein the processor is configured to determine the number of removed bits $N_R$ on the basis of the following equation:

$$N_R = \text{round}(ap+b),$$

wherein round( . . . ) denotes a rounding function and a and b denote parameters, which depend on $N_{max}$ and the predefined code rate R.

3. The device of claim 2, wherein the device further comprises a memory unit and wherein the processor is configured to determine the parameters a and b on the basis of a look-up table stored in the memory.

4. The device of claim 3, wherein the processor is configured to determine the parameters a and b on the basis of auxiliary parameters a' and b' provided in the look-up table and the following equations:

$$a = f(R)a',$$

$$b = f(R)b',$$

wherein f(R) denotes a function of the predefined code rate R and wherein the auxiliary parameters a' and b' depend on $N_{max}$.

5. The device of claim 4, wherein the processor is configured to determine the auxiliary parameters a' and b' on the basis of the look-up table and the look-up table is:

| $N_{max}$ | b' | a' |
|---|---|---|
| 64 | 32.455 | −0.87273 |
| 128 | 77.319 | −1.2332 |
| 256 | 138.56 | −1.1028 |
| 512 | 275.89 | −1.1111 |
| 1024 | 572.83 | −1.1649 |

6. The device of claim 4, wherein the processor is configured to determine the parameters a and b on the basis of the auxiliary parameters a' and b' provided in the look-up table and the following equations:

$$a = R^2 a',$$

$$b = R^2 b'.$$

7. The device of claim 1, wherein the processor is configured to determine the number of removed bits $N_R$ on the basis of the following equation:

$$N_R = \max(0, \text{round}(ap+b)),$$

wherein round( . . . ) denotes a rounding function, max( . . . ) denotes the maximum function and a and b denote parameters, which depend on $N_{max}$ and the predefined code rate R.

8. A method for generating a polar code of length N and dimension K on the basis of an original polar code being defined by a code sequence S having $N_{max}$ bit indices, wherein the method comprises:

generating an auxiliary code sequence having $N_{max}/2$ bit indices by removing bit indices greater than or equal to $N_{max}/2$ from the code sequence S;

removing from the auxiliary code sequence the last $N_R$ bit indices to generate a modified auxiliary code sequence, wherein $N_R$ denotes the number of removed bits and wherein the number of removed bits $N_R$ is determined on the basis of $N_{max}$, N and a predefined code rate R; and generating the polar code of length N and dimension K by puncturing the original polar code on the basis of a puncturing set defined by the last $p=N_{max}-N$ bit indices of the modified auxiliary code sequence.

9. The method of claim 8, wherein the number of removed bits $N_R$ is determined on the basis of the following equation:

$$N_R = \text{round}(ap+b),$$

wherein round( . . . ) denotes a rounding function and a and b denote parameters, which depend on $N_{max}$ and the predefined code rate R.

10. The method of claim 9, wherein the parameters a and b are determined on the basis of a look-up table.

11. The method of claim 10, wherein the parameters a and b are determined on the basis of auxiliary parameters a' and b' provided in the look-up table and the following equations:

$$a = f(R)a',$$

$$b = f(R)b',$$

wherein f(R) denotes a function of the predefined code rate R and wherein the auxiliary parameters a' and b' depend on $N_{max}$.

12. The method of claim 11, wherein the auxiliary parameters a' and b' are determined on the basis of the look-up table and the look-up table is:

| $N_{max}$ | b' | a' |
|---|---|---|
| 64 | 32.455 | −0.87273 |
| 128 | 77.319 | −1.2332 |
| 256 | 138.56 | −1.1028 |
| 512 | 275.89 | −1.1111 |
| 1024 | 572.83 | −1.1649 |

13. The method of claim 11, wherein the parameters a and b are determined on the basis of the auxiliary parameters a' and b' provided in the look-up table and the following equations:

$$a = R^2 a',$$

$$b = R^2 b'.$$

14. The method of claim 8, wherein the number of removed bits $N_R$ is determined on the basis of the following equation:

$$N_R = \max(0, \text{round}(ap+b)),$$

wherein round( . . . ) denotes a rounding function, max( . . . ) denotes the maximum function and a and b denote parameters, which depend on $N_{max}$ and the predefined code rate R.

15. A non-transitory computer storage medium storing a program code, wherein when the program code is executed by a computer, the program code causes the computer to perform:

generating an auxiliary code sequence having $N_{max}/2$ bit indices by removing bit indices greater than or equal to $N_{max}/2$ from the code sequence S;

removing from the auxiliary code sequence the last $N_R$ bit indices to generate a modified auxiliary code sequence, wherein $N_R$ denotes the number of removed bits and wherein the number of removed bits $N_R$ is determined on the basis of $N_{max}$, N and a predefined code rate R; and generating the polar code of length N and dimension K by puncturing the original polar code on the basis of a puncturing set defined by the last $p=N_{max}-N$ bit indices of the modified auxiliary code sequence.

16. The computer storage medium of claim 15, wherein the number of removed bits $N_R$ is determined on the basis of the following equation:

$N_R = \text{round}(ap+b)$, wherein round( . . . ) denotes a rounding function and a and b denote parameters, which depend on $N_{max}$ and the predefined code rate R.

17. The computer storage medium of claim 16, wherein the parameters a and b are determined on the basis of a look-up table.

18. The computer storage medium of claim 17, wherein the parameters a and b are determined on the basis of auxiliary parameters a' and b' provided in the look-up table and the following equations:

$a = f(R)a'$, $b = f(R)b'$, wherein f(R) denotes a function of the predefined code rate R and wherein the auxiliary parameters a' and b' depend on $N_{max}$.

19. The computer storage medium of claim 18, wherein the auxiliary parameters a' and b' are determined on the basis of the look-up table and the look-up table is:

| $N_{max}$ | b' | a' |
| --- | --- | --- |
| 64 | 32.455 | −0.87273 |
| 128 | 77.319 | −1.2332 |
| 256 | 138.56 | −1.1028 |
| 512 | 275.89 | −1.1111 |
| 1024 | 572.83 | −1.1649 |

20. The computer storage medium of claim 19, wherein the parameters a and b are determined on the basis of the auxiliary parameters a' and b' provided in the look-up table and the following equations:

$a = R^2 a'$, $b = R^2 b'$.

21. The computer storage medium of claim 15, wherein the number of removed bits $N_R$ is determined on the basis of the following equation:

$N_R = \max(0, \text{round}(ap+b))$, wherein round( . . . ) denotes a rounding function, max( . . . ) denotes the maximum function and a and b denote parameters, which depend on $N_{max}$ and the predefined code rate R.

* * * * *

UNITED STATES PATENT AND TRADEMARK OFFICE
CERTIFICATE OF CORRECTION

PATENT NO. : 11,245,422 B2
APPLICATION NO. : 16/998290
DATED : February 8, 2022
INVENTOR(S) : Mikhail Sergeevich Kamenev et al.

Page 1 of 1

It is certified that error appears in the above-identified patent and that said Letters Patent is hereby corrected as shown below:

In the Claims

In Column 11, Line 22, in Claim 3, after "memory" delete "unit".

Signed and Sealed this
Twenty-sixth Day of July, 2022

Katherine Kelly Vidal
*Director of the United States Patent and Trademark Office*